(12) United States Patent
Chiaretti et al.

(10) Patent No.: US 10,018,835 B2
(45) Date of Patent: Jul. 10, 2018

(54) PROJECTIVE MEMS DEVICE FOR A PICOPROJECTOR OF THE FLYING SPOT TYPE AND RELATED MANUFACTURING METHOD

(71) Applicant: STMICROELECTRONICS S.R.L., Agrate Brianza (IT)

(72) Inventors: Guido Chiaretti, Milan (IT); Fabio Luigi Grilli, Monza (IT); Roberto Carminati, Piancogno (IT); Bruno Murari, Monza (IT); Lorenzo Sarchi, Piacenza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/280,704

(22) Filed: Sep. 29, 2016

(65) Prior Publication Data
US 2017/0269355 A1    Sep. 21, 2017

(30) Foreign Application Priority Data

Mar. 18, 2016 (IT) .................. 102016000028779

(51) Int. Cl.
| | | |
|---|---|---|
| *G02B 26/10* | (2006.01) | |
| *H04N 9/31* | (2006.01) | |
| *G03B 21/28* | (2006.01) | |

(52) U.S. Cl.
CPC ........... *G02B 26/103* (2013.01); *G03B 21/28* (2013.01); *H04N 9/3129* (2013.01)

(58) Field of Classification Search
CPC ..... G02B 26/103; G03B 21/28; H04N 9/3129
See application file for complete search history.

(56) References Cited

U.S. PATENT DOCUMENTS

| | | |
|---|---|---|
| 6,124,663 A | 9/2000 | Haake et al. |
| 6,164,837 A | 12/2000 | Haake et al. |
| | (Continued) | |

FOREIGN PATENT DOCUMENTS

| | | |
|---|---|---|
| DE | 201 22 526 U1 | 6/2006 |
| EP | 2 330 461 A1 | 6/2011 |
| | (Continued) | |

OTHER PUBLICATIONS

Ide et al., "Compact multiple laser bean scanning module for high-resolution pico-projector applications using a fiber bundle combiner," *Advances in Display Technologies IV, Proceedings of SPIE*, 9005: 90050F-1-90050F-12, 2014. (12 pages).

(Continued)

*Primary Examiner* — Michael Teitelbaum
(74) *Attorney, Agent, or Firm* — Seed IP Law Group LLP

(57) ABSTRACT

A projective MEMS device, including: a fixed supporting structure made at least in part of semiconductor material; and a number of projective modules. Each projective module includes an optical source, fixed to the fixed supporting structure, and a microelectromechanical actuator, which includes a mobile structure and varies the position of the mobile structure with respect to the fixed supporting structure. Each projective module further includes an initial optical fiber, which is mechanically coupled to the mobile structure and optically couples to the optical source according to the position of the mobile structure.

20 Claims, 7 Drawing Sheets

(56) References Cited

U.S. PATENT DOCUMENTS

| | | | |
|---|---|---|---|
| 8,355,013 B2 | 1/2013 | Sprague et al. | |
| 2006/0222286 A1 | 10/2006 | Spoonhower et al. | |
| 2011/0317972 A1* | 12/2011 | Zhang .................. | G02B 6/4221 385/135 |
| 2012/0113514 A1 | 5/2012 | Rodman | |
| 2012/0162077 A1 | 6/2012 | Sze et al. | |
| 2012/0214323 A1 | 8/2012 | Gore et al. | |
| 2014/0055364 A1 | 2/2014 | Sze et al. | |
| 2014/0211084 A1 | 7/2014 | Petronius et al. | |

FOREIGN PATENT DOCUMENTS

| | | |
|---|---|---|
| JP | 2014 178693 A | 9/2014 |
| KR | 2014 0026898 A | 3/2014 |
| KR | 2006 0070590 A | 12/2014 |
| UA | 74230 U | 10/2012 |

OTHER PUBLICATIONS

Ide et al., "Integrated Flat Packages RGB Laser Module Using Si-Platform Technology," *Advances in Display Technologies IV, Proceedings of SPIE*, pp. 828-831, 2013.

Pezeshki et al., "High Performance MEMS-Based Micro-Optic Assembly for Multi-Lane Transceivers," *Journal of Lightwave Technology* 32(16): 2796-2799, 2014.

Rui et al., "Optical design in illumination system of digital light processing projector using laser gradient-index lens," *Optical Engineering* 51(1): 013004-1-013004-7, 2012.

* cited by examiner

PROJECTIVE MEMS DEVICE FOR A PICOPROJECTOR OF THE FLYING SPOT TYPE AND RELATED MANUFACTURING METHOD

BACKGROUND

Technical Field

The present disclosure relates to a projective micro-electro-mechanical system (MEMS) device that may be used, for example, for forming a so-called picoprojector of the flying-spot type; further, the present disclosure relates to the related manufacturing method.

Description of the Related Art

As is known, numerous opto-electronic MEMS systems are today available, which are designed to generate images (for example, on corresponding screens) and are characterized by extremely small volumes; these opto-electronic MEMS systems are also known as "picoprojectors". In general, the volumes of current picoprojectors are so small as to enable inclusion of picoprojectors inside, for example, a cellphone. Picoprojectors may thus form so-called embedded modules of portable electronic devices, such as for example portable PCs, tablets, cellphones, etc.

A picoprojector generally comprises a corresponding projective device, which includes one or more optical sources and may implement different optical techniques.

For instance, the paper by Dawei Rui, et al., "Optical design in illumination system of digital light processing projector using laser and gradient-index lens", Optical Engineering 51(1) (January, 2012) describes a picoprojector that implements so-called digital light processing (DLP) and includes a plurality of micro-mirrors.

Likewise known are picoprojectors of the flying spot type, which are configured to generate, in use, a corresponding optical beam, the direction of propagation and the spectral composition of which are varied dynamically, for example by a mirror and one or more driving circuits, respectively, so that the optical beam may periodically scan a screen arranged at a distance, thus generating an image thereon. An example of picoprojector of the flying spot type is provided in the paper by Masafumi Ide, et al., "Compact multiple laser beam scanning module for high-resolution picoprojector applications using a fiber bundle combiner", Advances in Display Technologies IV, Proceedings of SPIE, Vol. 9005, 90050F-1-12.

In general, projective systems of the flying spot type are characterized by overall dimensions smaller than those of projective systems of a DLP type, thanks to the lower complexity.

This having been said, in the field of projective systems of the flying spot type, there is particularly felt the need to improve the optical characteristics of the optical beam generated, without penalizing the overall dimensions. As regards the optical characteristics of the optical beam, they comprise, among other things, power and divergence. In particular, as regards divergence, and assuming an orthogonal reference system xyz, with the axis z coinciding with the axis of the optical beam emitted, it is known that, in the presence of a difference between the divergence of the optical beam in the plane xz and the divergence of the optical beam in the plane yz, the so-called phenomenon of astigmatism arises; i.e., different components of the optical beam focus on different points, reducing the quality of the image generated.

BRIEF SUMMARY

One embodiment of the present disclosure is a projective device for a picoprojector of the flying spot type, which enables an at least partial improvement of one or more of the optical characteristics of the optical beam.

According to at least one embodiment of the present disclosure, a projective MEMS device includes a fixed supporting structure made at least in part of semiconductor material; and a number of projective modules. Each projective module includes an optical source fixed to the fixed supporting structure, a microelectromechanical actuator, and an initial optical fiber. The microelectromechanical actuator includes a mobile structure and is configured to vary a position of said mobile structure with respect to the fixed supporting structure. The initial optical fiber is mechanically coupled to said mobile structure and configured to optically couple to said optical source according to the position of said mobile structure.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
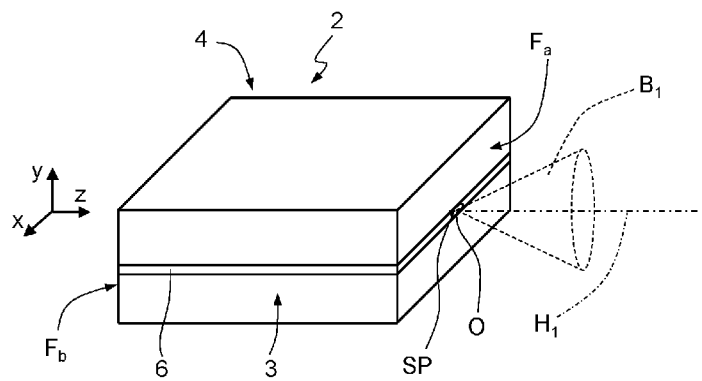
FIG. 1 is a schematic perspective view of a portion of an optical source.

FIG. 1 shows a first optical source, of a per se known type, which is formed by a first laser diode 2, configured to emit electromagnetic radiation with a first wavelength $\lambda_1$ (for example, in the blue, i.e., $\lambda_1 \approx 440$ nm), referred to hereinafter as the first optical beam $B_1$. In a per se known manner, the first laser diode 2 is formed by a die 4 of semiconductor material, which includes a semiconductor body 3, formed for example by binary, ternary, or quaternary alloys of semiconductors III-V or II-VI (for example, AlGaAs or InGaN). The semiconductor body 3 is of a per se known type and includes, among other things, an optically active layer 6, which has the shape of a parallelepiped with a thickness smaller than (for example) 0.1 µm and may function as optical guide, inside which there occurs the phenomenon of laser generation. Purely by way of example, in what follows an orthogonal reference system xyz is assumed, arranged so that the optically active layer 6 is parallel to the plane xz. Further, the die 4 is delimited by a front facet $F_a$ and by a rear facet $F_b$, which are arranged perpendicular to the axis z.

In a per se known manner, the first laser diode 2 emits the first optical beam $B_1$ starting from the front facet $F_a$. For simplicity, in what follows it is assumed that the axis of propagation (designated by $H_1$) of the first optical beam $B_1$ coincides with the axis z. Furthermore, on the front facet $F_a$, the first optical beam $B_1$ forms a light spot SP, which, without any loss of generality, has for example an approximately elliptical shape, the axes of which are parallel to the axes x and y respectively and may range, for example, between 0.5 and 3 µm; in the example illustrated in FIG. 1, the spot SP has a geometrical center O arranged along the axis z. In addition, at output from the front facet $F_a$, the divergences of the first optical beam $B_1$ in the planes xz and yz are markedly different from one another, a fact that, as mentioned previously, could cause the so-called phenomenon of astigmatism.

In greater detail, and without any loss of generality, the first laser diode 2 is a so-called bare-chip, i.e., a chip without package. In this connection, once again without any loss of generality, the die 4 may be of the type with epitaxy in the respective bottom part and includes a bottom region (not illustrated) formed by a solder alloy, which includes, for example, gold and is designed to enable, in a per se known manner, fixing of the first laser diode 2 to a metal pad of an external structure. This bottom region thus also enables thermal dissipation of the first laser diode 2, with consequent improvement of performance of the latter. Said bottom region may have a thickness, for example, of 3 µm.

Figure 2:
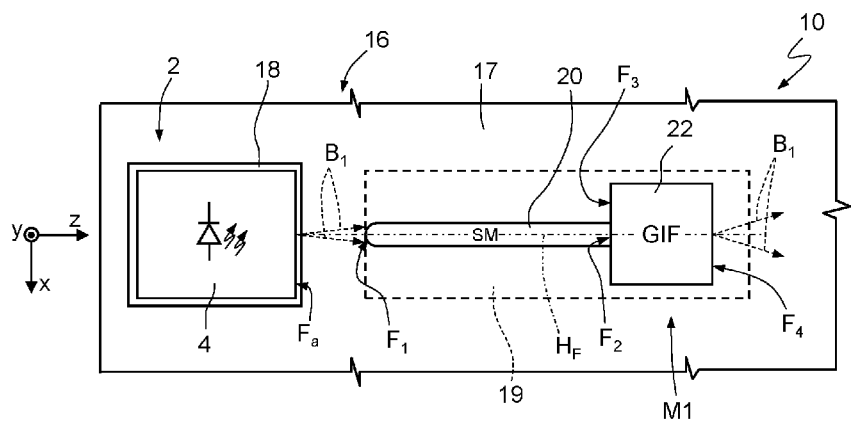
FIG. 2 is a schematic top plan view of a portion of an embodiment of the present projective MEMS device.

FIG. 2 (not in scale) shows a portion of a projective MEMS device 10, which includes a so-called silicon optical bench (SiOB), which is made at least in part of semiconductor material (for example, but not necessarily, silicon) and functions as support. For this reason, in what follows this optical bench is referred to as the semiconductor support 16. In addition, the semiconductor support 16 comprises a fixed structure 17 and a first mobile structure 19, the latter being represented (with a dashed line) in a purely qualitative way in FIG. 2. The details regarding the fixed structure 17 and the operative relation with the first mobile structure 19 are not shown in FIG. 2 either.

The projective MEMS device 10 further comprises a first single-mode optical fiber 20 and a first multi-mode optical fiber 22.

The first laser diode 2, the first single-mode optical fiber 20 and the first multi-mode optical fiber 22 are coupled to the semiconductor support 16, as described in greater detail hereinafter and are optically coupled together, so that the first single-mode optical fiber 20 is optically arranged between the first laser diode 2 and the first multi-mode optical fiber 22. Consequently, the first optical beam $B_1$ traverses in succession the first single-mode optical fiber 20 and the first multi-mode optical fiber 22. In other words, from the standpoint of the first optical beam $B_1$, the first single-mode optical fiber 20 and the first multi-mode optical fiber 22 function as initial optical fiber and subsequent optical fiber, respectively.

The first single-mode fiber 20 is delimited by a first facet $F_1$ and a second facet $F_2$ and has a so-called core having a diameter comprised, for example, between 2 µm and 8 µm. Further, the first single-mode optical fiber 20 has a length comprised, for example, between 300 µm and 700 µm. The first facet $F_1$ faces the front facet $F_a$ of the first laser diode 2, so that at least a portion of the first optical beam $B_1$ couples to the first single-mode optical fiber 20 through the first facet $F_1$. In this connection, for brevity, in what follows the portion of first optical beam $B_1$ that couples to the first single-mode optical fiber 20 will also be referred to as the first optical beam $B_1$. More in general, given a point of an optical path that connects the first laser diode 2 to a common output (described hereinafter) and is followed by the first optical beam $B_1$, in this point the portion of first optical beam $B_1$ that is to reach the common output will be referred to as the first optical beam $B_1$. In other words, the optical losses are neglected.

In greater detail, in a per se known manner, the first facet $F_1$ of the first single-mode optical fiber 20 may form a corresponding lens of a type known, designed to increase the efficiency of optical coupling between the first laser diode 2 and the first single-mode optical fiber 20. In other words, the first single-mode optical fiber 20 may be a so-called "lensed fiber". The second facet $F_2$ may be of a plane type.

As regards the first multi-mode optical fiber 22, in one embodiment it is a so-called graded-index or gradient-index fiber (GIF), i.e., a multi-mode fiber on which the refractive index of the core, in addition to being higher than the refractive index of the cladding, follows a graded profile, and in particular is of a parabolic type. The outer diameter of the first multi-mode optical fiber 22 may be larger than or equal to the outer diameter of the first single-mode optical fiber 20.

In greater detail, the first multi-mode optical fiber 22 is delimited by a further pair of facets, referred to hereinafter as the third facet $F_3$ and the fourth facet $F_4$, respectively. The third facet $F_3$ is arranged in contact with the second facet $F_2$ of the first single-mode optical fiber 20. In addition, in the embodiment illustrated in FIG. 2, the axes of the first single-mode optical fiber 20 and of the first multi-mode optical fiber 22 coincide and consequently form a single axis $H_F$, referred to hereinafter as the axis of the fiber $H_F$.

In even greater detail, in a cross-section perpendicular to the axis of the first multi-mode optical fiber 22, the refractive index of the core of the first multi-mode optical fiber 22 is, for example, directly proportional to $1-(d/R)^2$, where R is the radius of the core of the first multi-mode optical fiber 22 and d is the distance from the axis of the fiber.

In practice, the first multi-mode optical fiber 22 functions as so-called "selfoc lens" and is characterized by a corresponding pitch length. As a function of the ratio existing between its own length and the pitch length (or in any case an integer multiple of the pitch length), the first multi-mode optical fiber 22 may generate at output a focused, a collimated, or a divergent beam, and further may enlarge or reduce the beam at input. For instance, assuming that in the first multi-mode optical fiber 22 there enters a generic beam with cylindrical symmetry, denoting by P and L the pitch length and the length of the first multi-mode optical fiber 22, respectively, and limiting our attention to considering the case L≤P, we find that: if $¼\,P<L<½\,P$, the beam at output is focused; if $L=¼\,P$, the beam at output is collimated; and if $L<¼\,P$, the beam at output is divergent.

In practice, temporarily neglecting the question of the coupling between the first laser diode 2 and the first single-mode optical fiber 20, it may be found that the length of the first single-mode optical fiber 20 is such that, at output from the second facet $F_2$, the first optical beam $B_1$ has a cylindrical symmetry, as a result of the symmetry of the first single-mode optical fiber 20, in which it has propagated. In this way, at output from the first single-mode optical fiber 20, the first optical beam $B_1$ is substantially immune from the phenomenon of astigmatism. From a quantitative standpoint, on the second facet $F_2$ of the first single-mode optical fiber 20, the first optical beam $B_1$ has a diameter and a divergence that depend upon the first single-mode optical fiber 20. For instance, the first optical beam $B_1$ may have, on the second facet $F_2$ of the first single-mode optical fiber 20, a diameter (at $1/e^2$) comprised between 3 µm and 8 µm; further, the first optical beam $B_1$ has to a first approximation a spatial profile of a Gaussian type with a beam waist on the second facet $F_2$ (radius of the Gaussian beam at $1/e^2$) comprised, for example, between 1.5 μm and 4 μm. Then, the first optical beam $B_1$ interacts with the first multi-mode optical fiber 22, which renders it, for example, collimated.

As mentioned previously, the projective MEMS device 10 further comprises the first mobile structure 19, which is mobile with respect to the fixed structure 17, to which it is coupled by using deformable elastic elements (not illustrated in FIG. 2) of semiconductor material.

In greater detail, whereas the first laser diode 2 is fixed to the fixed structure 17, the first single-mode optical fiber 20 and the first multi-mode optical fiber 22 are, instead, coupled to the first mobile structure 19, which may move, with respect to the fixed structure 17, in directions parallel to any one of the axes x, y, z. In particular, the first single-mode optical fiber 20, the first multi-mode optical fiber 22, and the first mobile structure 19 are substantially fixed with respect to one another and mobile with respect to the fixed structure 17, and thus with respect to the first laser diode 2.

As described in greater detail hereinafter, the first mobile structure 19 may be controlled electrically so as to vary the optical coupling between the first laser diode 2 and the first single-mode optical fiber 20, and in particular between the front facet $F_a$ of the first laser diode 2 and the first facet $F_1$ of the first single-mode optical fiber 20. In this connection, the first laser diode 2 is fixed to the fixed structure 17 in a per se known manner, for example with techniques of automatic alignment that do not envisage turning-on of the first laser diode 2. For instance, the fixed structure 17 may include a first metal pad 18 (made, for example, of gold or an alloy of tin and gold), fixed on which is the first laser diode 2, for example by a soldering process that involves the bottom region (not illustrated) of the die 4 of the first laser diode 2. In this way, the first laser diode 2 is positioned with a tolerance in the region of ±5 μm parallel to the axes x and y, as well as with a tolerance in the region of ±3 μm parallel to the axis z. It is in any case possible to fix the first laser diode 2 to the fixed structure 17 by using alternative techniques, such as for example by using automatic image-recognition systems, or else using three-dimensional mechanical coupling structures. In the latter case, it is, for example, possible for the fixed structure 17 to form three-dimensional coupling elements designed to couple mechanically to the first laser diode 2 so as to constrain it with tolerances of ±1 μm.

As clarified hereinafter, by appropriately moving the first mobile structure 19, it is thus possible to reduce the coupling losses between the first laser diode 2 and the first single-mode optical fiber 20 so that they fall within 1.5 dB. For instance, it is possible to get the geometrical center O of the spot SP to lie along the axis of the fiber $H_F$.

Figure 3:
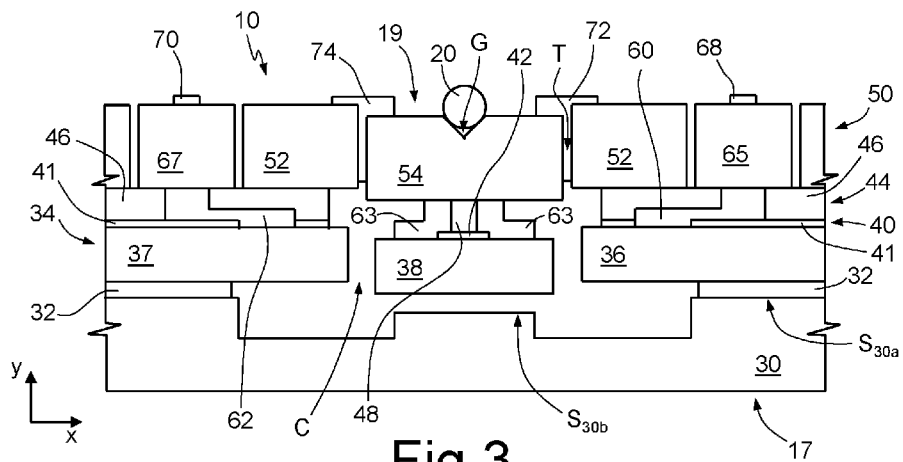
FIG. 3 is a schematic cross-sectional view of a portion of an embodiment of the present projective MEMS device.

As shown in FIG. 3, the fixed structure 17 of the projective MEMS device 10 comprises a cap 30 of semiconductor material (for example, silicon), a glass-frit region 32 and an epitaxial region 34, which is made of semiconductor material and in turn includes a first fixed epitaxial sub-region 36 and a second fixed epitaxial sub-region 37 and a mobile epitaxial sub-region 38.

The epitaxial region 34 delimits a cavity C, extending inside which is the mobile epitaxial sub-region 38, which is arranged between the first and second fixed epitaxial sub-regions 36, 37. As mentioned previously and as described in greater detail hereinafter, the mobile epitaxial sub-region 38 forms a suspended mass, which is connected to the fixed structure 17 of the semiconductor support 16 (and thus also to the first and second fixed epitaxial sub-regions 36, 37) through one or more elastic semiconductor elements (designated by 100 in FIG. 4), which function as springs and enable the mobile epitaxial sub-region 38, and thus the first mobile structure 19 to move with respect to the first and second fixed epitaxial sub-regions 36, 37, and more in general with respect to the fixed structure 17, in the absence of blocking regions described hereinafter.

The glass-frit region 32 is arranged between the epitaxial region 34 and the cap 30 so as to bond them together.

The fixed structure 17 further comprises a first dielectric region 40 and a second dielectric region 44, made for example of TEOS oxide.

The first dielectric region 40 comprises a first fixed dielectric region 41 and a first mobile dielectric region 42. The first fixed dielectric region 41 overlies the first and second fixed epitaxial sub-regions 36, 37, with which it is in direct contact. The first mobile dielectric region 42 overlies the mobile epitaxial sub-region 38, with which it is in direct contact.

The second dielectric region 44 comprises a second fixed dielectric region 46 and a second mobile dielectric region 48. The second fixed dielectric region 46 overlies the first fixed dielectric region 41, with which it is in direct contact. The second mobile dielectric region 48 overlies the first mobile dielectric region 42, with which it is in direct contact.

The projective MEMS device 10 further comprises a substrate 50 of semiconductor material (for example, silicon), which includes a fixed portion 52 and a mobile portion 54. The fixed portion 52 extends over the second fixed dielectric region 46, with which it is in direct contact, whereas the mobile portion 54 extends over the second mobile dielectric region 48, with which it is in direct contact. Furthermore, the mobile portion 54 is separated from the fixed portion 52 by a trench T, which is in fluid communication with the underlying cavity C and has an annular shape. In what follows, the trench T is referred to as insulation trench T; further, in general it is assumed that the terms "annular" or "ring" do not necessarily imply a circular symmetry.

The projective MEMS device 10 further comprises a first electrical-connection region 60 and a second electrical-connection region 62, which are made of conductive material (for example, polysilicon) and extend through the first and second fixed dielectric regions 41, 46, until they contact the first and second fixed epitaxial sub-regions 36, 37, respectively. The projective MEMS device 10 further comprises an annular region 63, which surrounds, in direct contact, the first and second mobile dielectric regions 42, 48, and is physically separated from the first and second dielectric regions 40, 44. For instance, the annular region 63 is made of polysilicon or else silicon nitride. The mobile portion 54 of the substrate 50 also overlies the annular region 63, with which it is in direct contact. As mentioned previously, in top plan view the annular region 63 does not necessarily have a circular symmetry and may thus have, for example, a polygonal shape.

The projective MEMS device 10 further includes a first through-silicon via (TSV) and a second through-silicon via for providing electrical connections. In particular, the embodiment illustrated in FIG. 3 includes a first TSV 65 and a second TSV 67, which contact, respectively the first and second electrical-connection regions 60, 62. Furthermore, a second pad 68 and a third pad 70 of conductive material are present, which overlie respectively, in direct contact, the first and second TSVs 65, 67 so as to enable electrical connection of the projective MEMS device 10 to the outside world, for example by a so-called wire bonding, in order to bias the first and second fixed epitaxial sub-regions 36, 37.

In addition, the projective MEMS device 10 comprises a first blocking region 72 and a second blocking region 74, which extend in corresponding separate portions of the trench T. The first and second blocking regions 72, 74 are made, for example, of a low-shrink adhesive material (for example, a low-stress, low-shrink adhesive that may be optically treated), treated thermally, for the reasons described hereinafter.

As regards the cap 30, it has a cap surface, which faces the epitaxial region 34 and is shaped so as to enable movement of the first mobile structure 19 parallel to the axis y. For instance, the cap 30 may be delimited at the top by a first cap surface (designated by $S_{30a}$), resting on which is the glass-frit region 32, and by a second cap surface $S_{30b}$, arranged at a height lower than the height of the first cap surface $S_{30a}$, so that, as clarified hereinafter, the mobile epitaxial sub-region 38 may be located at a height lower than that of the first and second fixed epitaxial sub-regions 36, 37.

In greater detail, a top portion of the mobile portion 54 of the substrate 50 forms a groove G, which is for example V-shaped in a plane parallel to the plane yx and is designed to house at least a portion of the first single-mode optical fiber 20 and a portion of the first multi-mode optical fiber 22. In other words, the groove G functions as recess designed to carry the first single-mode optical fiber 20 and the first multi-mode optical fiber 22; further, the groove G has a longitudinal axis parallel to the axis of the fiber $H_F$. In addition, as mentioned previously, in the absence of the first and second blocking regions 72, 74, the first mobile structure 19 may move the first single-mode optical fiber 20 and the first multi-mode optical fiber 22 with respect to the first laser diode 2, which is fixed to the fixed structure 17 since, in the absence of the first and second blocking regions 72, 74, the first mobile structure 19 is in fact mobile with respect to the fixed structure 17.

Figure 4:
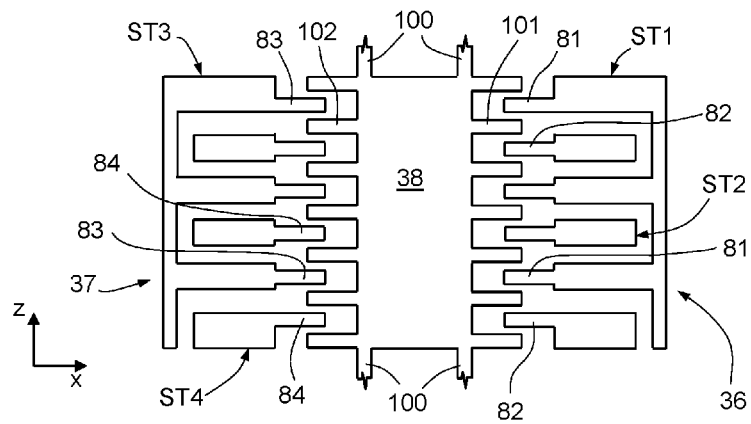
FIG. 4 is a schematic top plan view of a portion of an embodiment of the present projective MEMS device.

As illustrated in greater detail in FIG. 4, and without any loss of generality, the first fixed epitaxial sub-region 36 forms a first stator ST1 and a second stator ST2. In turn, the first stator ST1 forms a plurality of elongated elements parallel to the direction x, referred to as the first stator elements 81, and the second stator ST2 forms a plurality of respective elongated elements parallel to the direction x, referred to as the second stator elements 82. Likewise, the second fixed epitaxial sub-region 37 forms a third stator ST3 and a fourth stator ST4. In turn, the third stator ST3 forms a plurality of respective elongated elements parallel to the direction x, referred to as the third stator elements 83, and the fourth stator ST4 forms a plurality of respective elongated elements parallel to the direction x, referred to as the fourth stator elements 84. In addition, without any loss of generality, the mobile epitaxial sub-region 38 has in top plan view the shape of a parallelepiped. Branching off from two sides of this parallelepiped, opposite to one another and facing the first and second fixed epitaxial sub-regions 36, 37, respectively, are a respective first and second plurality of corresponding elongated elements parallel to the axis x, referred to hereinafter as the first rotor elements 101 and the second rotor elements 102.

In greater detail, the first and second stator elements 81, 82 are spaced apart from one another and are arranged parallel to the axis z, in an alternating way. Likewise, the third and the fourth stator elements 83, 84 are spaced apart from one another and are arranged parallel to the axis z, in an alternating way. Furthermore, the first rotor elements 101 are comb-fingered with the elongated elements of the first fixed epitaxial sub-region 36, whereas the second rotor elements 102 are comb-fingered with the elongated elements of the second fixed epitaxial sub-region 37. More in particular, at least one set of first rotor elements 101 is present, each of which is arranged between a corresponding pair formed by a first stator element 81 and a second stator element 82 adjacent to one another. Likewise at least one set of second rotor elements 102 is present, each of which is arranged between a corresponding pair formed by a third stator element 83 and a fourth stator element 84 adjacent to one another.

Once again with reference to the elastic semiconductor elements 100, without any loss of generality and in a way per se known manner, they are connected indirectly to the first and second fixed epitaxial sub-regions 36, 37, i.e., they are connected mechanically to the latter, so that they may be set at a potential different from the potentials of the first and second fixed epitaxial sub-regions 36, 37.

In use, the mobile epitaxial sub-region 38 may be set at ground. In addition, if a positive voltage is applied to the third and fourth stator elements 83, 84, the mobile epitaxial sub-region 38 undergoes the action of an electrostatic force that causes a translation thereof in a direction parallel and opposite to the axis x; likewise, if a positive voltage is applied to the first and second stator elements 81, 82, the mobile epitaxial sub-region 38 translates parallel to and in a direction concordant with the axis x. If, instead, a positive voltage is applied to the first and third stator elements 81, 83, the mobile epitaxial sub-region 38 translates parallel to and in a direction concordant with the axis z. In addition, by applying a positive voltage on the second and fourth stator elements 82, 84, the mobile epitaxial sub-region 38 translates parallel to and in a direction discordant with respect to the axis z.

As regards, instead, possible translations of the mobile epitaxial sub-region 38 parallel to the axis y, it is, for example, possible to connect to ground the mobile epitaxial sub-region 38 and apply a positive or negative voltage to the cap 30, in which case the mobile epitaxial sub-region 38 translates parallel to the axis y, in the direction of the cap.

In practice, the first and second epitaxial sub-regions 36, 37 and the first mobile structure 19 form a corresponding microelectromechanical actuator designed to change the position of the first single-mode optical fiber 20 and of the first multi-mode optical fiber 22 with respect to the fixed structure 17, and thus with respect to the first laser diode 2. Furthermore, it may be shown that the first mobile structure 19 may be moved with respect to the fixed structure 17 with an accuracy of 0.1 µm, parallel to each of the axes x, y, z. Consequently, the first facet $F_1$ of the first single-mode optical fiber 22 may be shifted with respect to the front facet $F_a$ with the aforesaid accuracy.

The first laser diode 2, the first mobile structure 19, the first single-mode optical fiber 20, and the first multi-mode optical fiber 22 thus form a sort of first projective module M1, the axis of which coincides with the axis of the fiber $H_F$. In addition, in the absence of the first and second blocking regions 72, 73, it is possible to align the center of emission of the first laser diode 2 (i.e., the geometrical center O of the spot SP) to the axis of the fiber $H_F$ with a tolerance of ±0.1 µm, thus optimizing the effectiveness of the optical coupling. Furthermore, at output from the first projective module, the first optical beam $B_1$ is substantially immune from astigmatism and possesses the desired characteristics of collimation.

Figure 5:
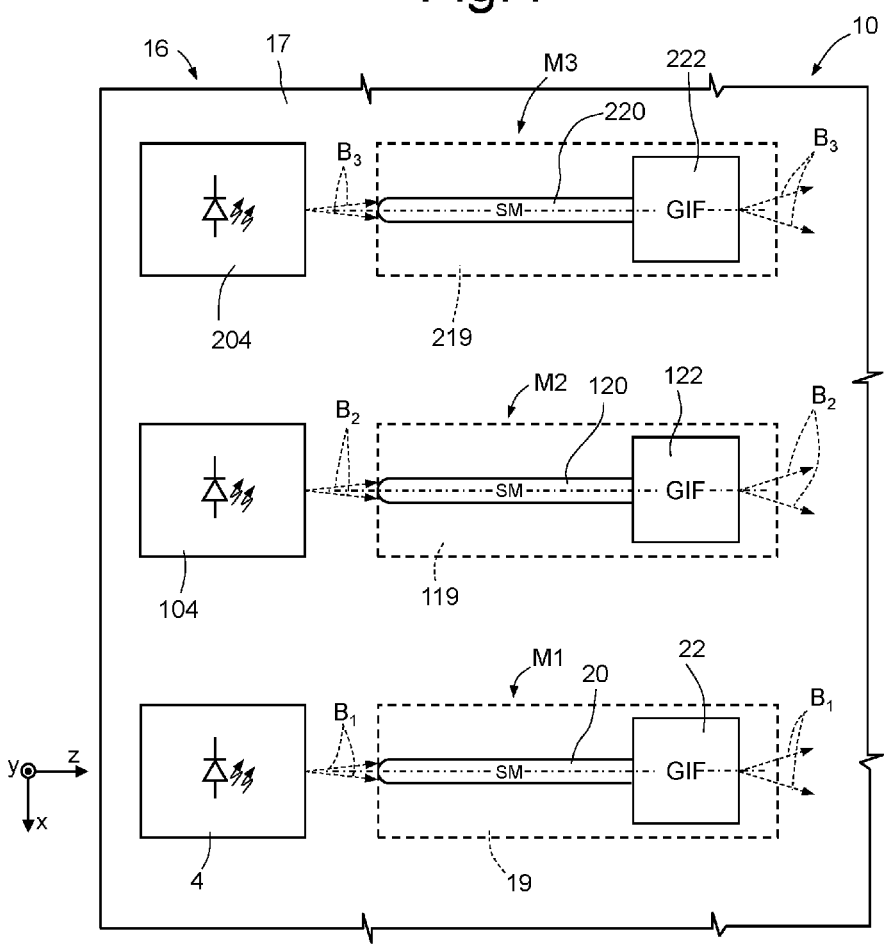
FIG. 5 is a schematic top plan view of a portion of an embodiment of the present projective MEMS device.

As illustrated in FIG. 5, the projective MEMS device 10 comprises a second projective module M2 and a third projective module M3, which may, for example, be equal to the first projective module M1, but for the differences that will be mentioned hereinafter. Consequently, the second projective module M2 comprises, among other things, a second laser diode 104, a second single-mode optical fiber 120, a second multi-mode optical fiber 122, and a second mobile structure 119. Likewise, the third projective module M3 comprises, among other things, a third laser diode 204, a third single-mode optical fiber 220, a third multi-mode optical fiber 222, and a third mobile structure 219. Mechanical coupling between the fixed structure 17 and the second and third mobile structures 119, 219 is obtained in the same way as what has been described as regards the first mobile structure 19 and in particular in connection with the mobile epitaxial sub-region 38 and the first and second fixed epitaxial sub-regions 36, 37. Furthermore, each one of the first, second, and third projective modules M1, M2, M3, and thus each one of the corresponding mobile epitaxial sub-regions may be controlled independently of the others. For instance, the pair formed by the first and second fixed epitaxial sub-regions of each one of the first, second, and third projective modules M1, M2, M3 may be rendered electrically independent of the other two pairs.

As regards the aforementioned differences, the second laser diode 104 emits electromagnetic radiation at a second wavelength $\lambda_2$ (for example, in the red, i.e., $\lambda_2 \approx 638$ nm), referred to hereinafter as the second optical beam $B_2$. The third laser diode 204 emits electromagnetic radiation with a third wavelength $\lambda_3$ (for example, in the green, i.e., $\lambda_3 \approx 530$ nm), referred to hereinafter as the third optical beam $B_3$.

The first, second, and third projective modules M1, M2, M3, and more precisely the respective multi-mode optical fibers, emit the first, second, and third optical beams $B_1$, $B_2$, $B_3$, respectively, so that they will have substantially parallel axes of propagation.

In practice, and without any loss of generality, the projective MEMS device 10 is thus suited to forming a picoprojector of an RGB type.

Figure 6:
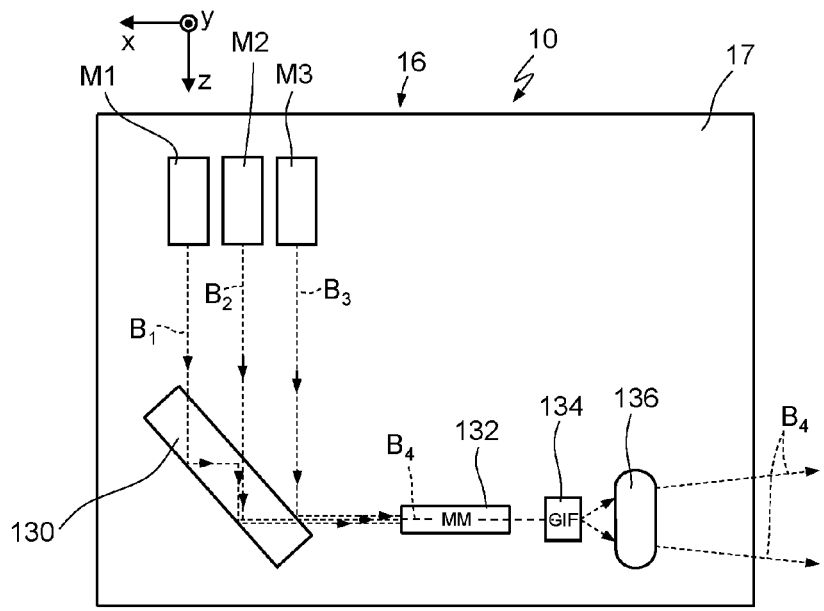
FIG. 6 is a schematic top plan view of an embodiment of the present projective MEMS device.

As shown in FIG. 6, the projective MEMS device 10 further comprises an optical device with dichroic behavior, referred to hereinafter as the optical coupler 130.

The optical coupler 130 is of a per se known type and is mechanically fixed to the fixed structure 17 of the semiconductor support 16. Furthermore, the optical coupler 130 is designed to receive at input the first, second, and third optical beams $B_1$, $B_2$, $B_3$, which are spatially separate, and to generate at output a fourth optical beam $B_4$. In particular, the fourth optical beam $B_4$ is given by the spatial superposition of the first, second, and third optical beams $B_1$, $B_2$, $B_3$, the axes of which, at output from the optical coupler 130, substantially coincide. The output of the optical coupler 130 thus forms the aforementioned common output.

In practice, the optical coupler 130 functions as a so-called "wavelength-division multiplexer" (WDM); further, before impinging upon the optical coupler 130, the first, second, and third optical beams $B_1$, $B_2$, $B_3$ propagate in air.

As shown once again in FIG. 6, the projective MEMS device 10 further comprises a fourth multi-mode optical fiber 132 and a fifth multi-mode optical fiber 134, as well as a lens 136. There are, however, possible embodiments in which one or more of the fourth multi-mode optical fiber 132, the fifth multi-mode optical fiber 134, and the lens 136 are absent.

The fourth multi-mode optical fiber 132 has a core with constant refractive index (i.e., not graded) and is designed to receive the fourth optical beam $B_4$, after the latter has been emitted by the optical coupler 130 and has propagated for a stretch in air. Furthermore, the fourth multi-mode optical fiber 132 performs the task of aligning further the propagation of the optical beams and reducing possible residual misalignments present between the first, second, and third optical beams $B_1$, $B_2$, $B_3$ at output from the optical coupler 130. For instance, the fourth multi-mode optical fiber 132 has a length comprised between 300 µm and 1000 µm.

The fifth multi-mode optical fiber 134 has a core with graded refractive index; in particular, the refractive index has a parabolic profile. For instance, the fifth multi-mode optical fiber 134 has a length comprised between 200 µm and 1000 µm; further, the input facet of the fifth multi-mode optical fiber 134 is, for example, arranged in contact with the output facet of the fourth multi-mode optical fiber 132. The fifth multi-mode optical fiber 134 performs the function of adapting the divergence of the fourth optical beam $B_4$ as a function of the optical components (for example, mirrors for carrying out scanning) of a picoprojector that incorporates the projective MEMS device 10, these optical components being arranged downstream of the latter.

The lens 136 is arranged downstream of the fifth multi-mode optical fiber 134 and may form the lens of the projective MEMS device 10, or else the lens of the picoprojector that incorporates the projective MEMS device 10.

In general, irrespective of the components arranged downstream of the optical coupler 130, the lengths of the multi-mode optical fibers of each one of the first, second, and third projective modules M1, M2, M3 may be determined, for example, on the basis of a desired beam waist on a screen arranged at a given distance. In this case, it is possible to calculate the corresponding beam waist on the mirrors of the picoprojector (comprised, for example, between 500 µm and 1000 µm). Then the divergence and size of each optical beam generated by each projective module is determined as a function of the distance of each multi-mode optical fiber from the mirrors and of the optical path followed by the corresponding optical beam. For standard applications, the optical beams—may exit substantially collimated from the multi-mode fibers of the corresponding projective modules.

Figure 7:
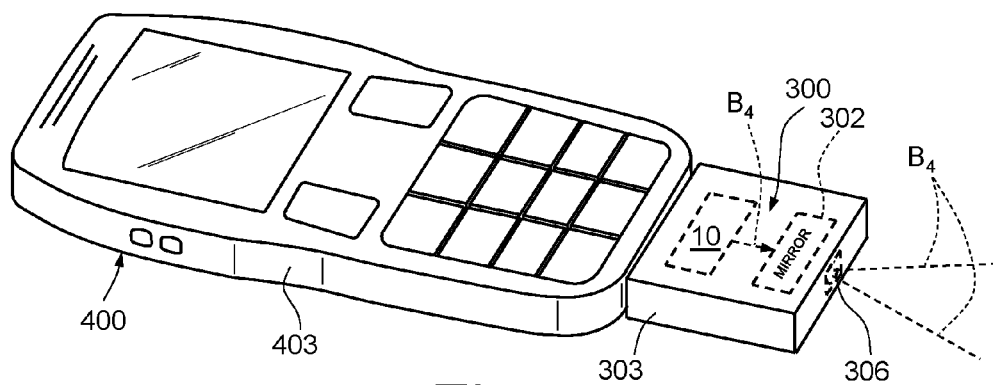
FIGS. 7 and 8 are schematic perspective views of portable apparatuses that include the present projective MEMS device.

As illustrated in FIG. 7, the projective MEMS device 10 may in fact form a projective MEMS system (i.e., a picoprojector) 300, which further includes at least one mirror 302 (for example, of a MEMS type) designed to receive the fourth optical beam $B_4$ and to change the direction of propagation thereof for scanning an area. Albeit not shown, the projective MEMS system 300 may further include driving circuits designed to change the intensity of the first, second, and third optical beams $B_1$, $B_2$, $B_3$.

The projective MEMS system 300 may be a separate accessory, which may be mechanically and electrically coupled to a portable electronic apparatus 400, such as for example a cellphone or smartphone (or else, for example, a PDA, a tablet, a digital audio player, or a controller for video games). In this case, the projective MEMS system 300 is provided with an own casing 303, which has at least one portion 306 transparent to the fourth optical beam $B_4$, reflected by the mirror 302. The casing 303 of the projective MEMS system 300 is releasably coupled to a casing 403 of the portable electronic apparatus 400.

Figure 8:
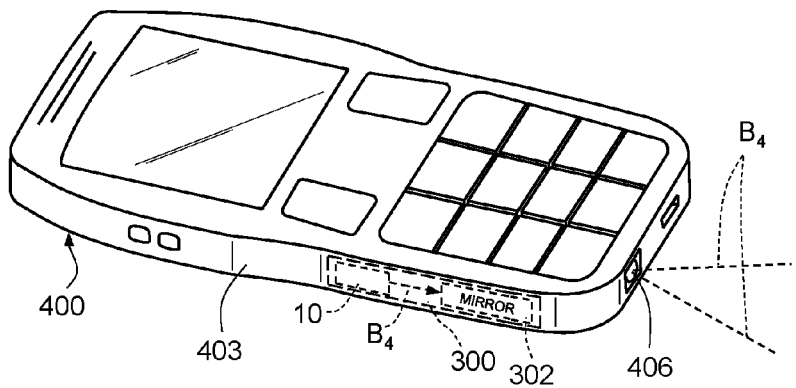

Alternatively, as illustrated in FIG. 8, the projective MEMS system 300 may be integrated within the portable electronic apparatus 400, being arranged inside the casing 403 of the portable electronic apparatus 400 itself, which has in this case a respective portion 406 transparent to the fourth optical beam $B_4$ reflected by the mirror 302. In this case, the projective MEMS system 300 is, for example, coupled to a printed circuit present within the casing 403 of the portable electronic apparatus 400.

The present projective MEMS device may be manufactured by carrying out the process described hereinafter, which refers to an embodiment slightly different from the one shown in FIG. 3, as pointed out at the end of the description of the process. In addition, the ensuing description is limited to the steps of manufacture of the first projective module M1, located in a portion of a microelectronic structure 500; these steps also involve other portions of the microelectronic structure 500, for leading to formation also of the second and third projective modules M2, M3.

Figure 9:
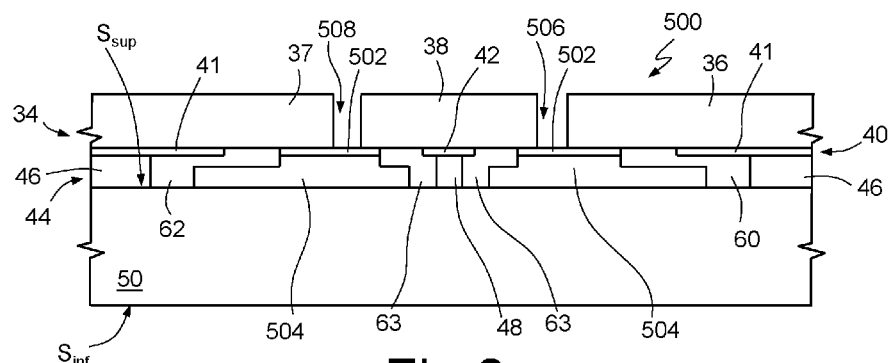
FIGS. 9-18 are schematic cross-sectional views of portions of an embodiment of the present projective MEMS device, during successive steps of a manufacturing process.

In detail, as illustrated in FIG. 9, there is provided the microelectronic structure 500, which comprises the substrate 50 of semiconductor material, which has, for example, a thickness of 400 μm, and the first and second dielectric regions 40, 44, which have respective thicknesses for example of 2 μm and 1.5 μm. In what follows, referred to as bottom surface $S_{inf}$ and top surface $S_{sup}$ of the substrate 50 are the surfaces that, in this step of the manufacturing process, delimit the substrate 50 at the bottom and at the top, respectively, even though then, once the projective MEMS device 10 is completed, these surface are reversed. This having been said, the second dielectric region 44 is arranged on top of the top surface $S_{sup}$.

The first dielectric region 40 is arranged on top of the second dielectric region 44. Furthermore, the first dielectric region 40 includes the first fixed dielectric region 41 and the first mobile dielectric region 42. The second dielectric region 44 includes the second fixed dielectric region 46 and the second mobile dielectric region 48. Furthermore, the microelectronic structure 500 comprises the first and second electrical-connection regions 60, 62 and the annular region 63. In addition, the microelectronic structure 500 comprises a first sacrificial region 502 and a second sacrificial region 504, formed by the first and second dielectric regions 40, 44, respectively. Consequently, the first sacrificial region 502 is arranged on top of, and in direct contact with, the second sacrificial region 504. In particular, the first and second sacrificial regions 502, 504 have an annular shape and are arranged between the annular region 63, with which they are in direct contact, and the first and second electrical-connection regions 60, 62.

The microelectronic structure 500 further comprises the epitaxial region 34, which has a thickness comprised, for example, between 20 μm and 30 μm. In particular, the microelectronic structure 500 comprises the first and second fixed epitaxial sub-regions 36, 37. The first fixed epitaxial sub-region 36 overlies the first fixed dielectric region 41, the first electrical-connection region 60, and a first peripheral part of the first sacrificial portion 502. The second fixed epitaxial sub-region 37 overlies the first fixed dielectric region 41, the second electrical-connection region 62, and a second peripheral part of the first sacrificial portion 502.

The microelectronic structure 500 further comprises the mobile epitaxial sub-region 38, which is separated from the first and second fixed epitaxial sub-regions 36, 37 by a corresponding pair of trenches (designated by 506 and 508, respectively), referred to hereinafter as the first patterning trench 506 and the second patterning trench 506, 508, respectively. Albeit not visible in FIG. 9, also the elastic semiconductor elements 100 are already present. The mobile epitaxial sub-region 38 is, however, fixed with respect to the substrate 50 and to the first and second fixed epitaxial sub-regions 36, 37 on account of the presence of the first and second sacrificial regions 502, 504, which rigidly connect the mobile epitaxial sub-region 38 to the first and second fixed epitaxial sub-regions 36, 37.

Figure 10:
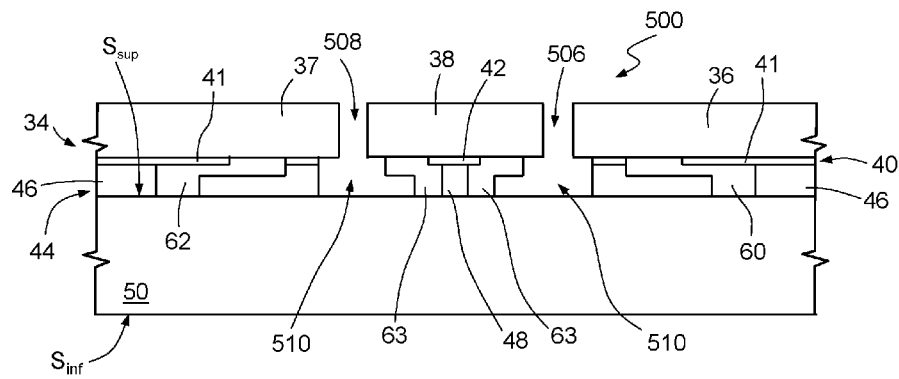

Next, as illustrated in FIG. 10, a wet etch is carried out using, for example, hydrofluoric acid (HF) for removing portions of the first and second sacrificial regions 502, 504 arranged underneath the first and second patterning trenches 506, 508, substantially without affecting the epitaxial region 34. During etching, the annular region 63 protects the first and second mobile dielectric regions 42, 48 and forms with the latter a sort of permanent-connection region, which connects the mobile epitaxial sub-region 38 to an underlying portion of the substrate 50. In the example illustrated in FIG. 10, the etch is such that the annular region 63 is exposed, whereas residual portions of the first and second sacrificial regions 502, 504, arranged in contact with the first and second electrical-connection regions 60, 62, respectively, remain and concur to forming, respectively, the first and second fixed dielectric regions 41, 46.

At the end of the operations illustrated in FIG. 10, the annular region 63 is surrounded by a cavity 510, referred to hereinafter as the process cavity 510. The process cavity 510 has a closed shape in top plan view.

Figure 11:
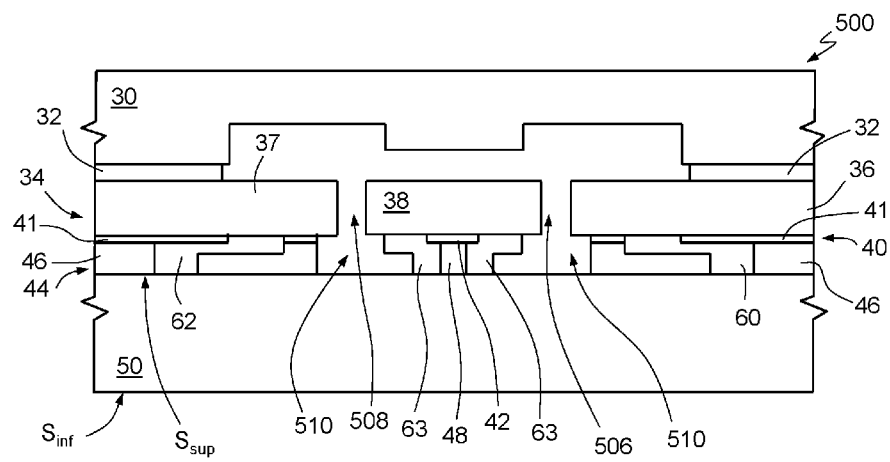

Next, as shown in FIG. 11, an operation of wafer-to-wafer bonding is carried out for fixing the cap 30 to the first and second fixed dielectric regions 36, 37, by interposition of the glass-frit region 32.

Figure 12:
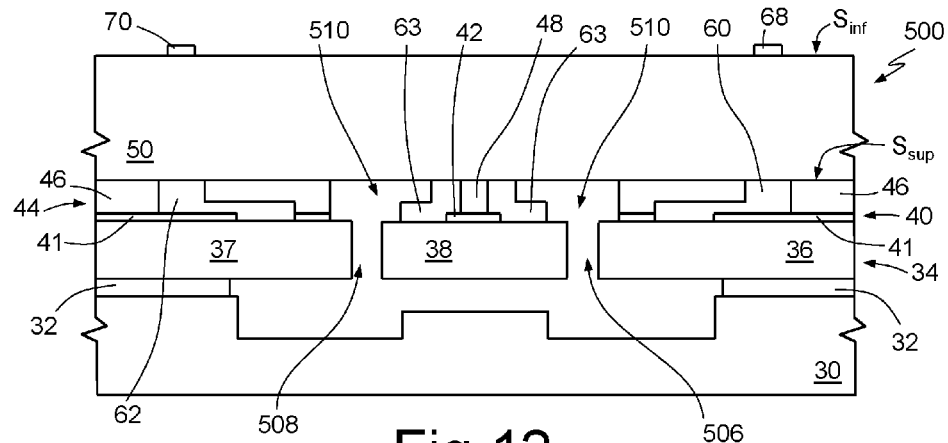

Next, as shown in FIG. 12, the microelectronic structure 500 is turned over and formed on the bottom surface $S_{inf}$ are the first pad (not illustrated in FIG. 12) and the second and third pads 68, 70.

Figure 13:
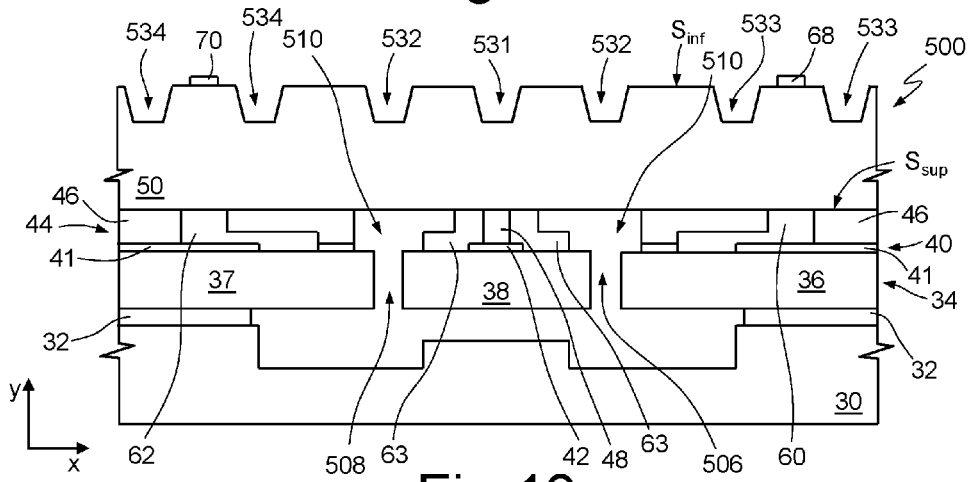

Next, as illustrated in FIG. 13, a process is carried out of photolithography and subsequent wet etching (for example, using potassium hydroxide, KOH) of the bottom surface $S_{inf}$ of the substrate 50 for removing selectively portions of the latter. In this way, a plurality of recesses is formed on the bottom surface $S_{inf}$.

In the example illustrated in FIG. 13, a first recess 531 is formed, elongated parallel to the axis z and having, in a plane perpendicular to the axis z, the shape of a isosceles trapezium, with minor base and sides formed by the substrate 50. More in particular, the minor base is parallel to the bottom surface $S_{inf}$, whereas the sides are transverse, but not perpendicular, with respect to the bottom surface $S_{inf}$.

In addition, a second recess 532 is formed, which, in top plan view, has an annular (and thus, closed and hollow) shape and surrounds the first recess 531. Likewise formed are a third recess 533 and a fourth recess 534, each of which has an annular shape, in top plan view, and surrounds the second and third pads 68, 70, respectively. In the example illustrated in FIG. 13, also the second, third, and fourth recesses 532, 533, 534 locally have cross-sections equal to the aforementioned trapezoidal cross-section of the first recess 531, even though this is not necessary for the purposes of the present disclosure. More in general, one or more of the first, second, third, and fourth recesses 531, 532, 533, 534 may have different shapes; for example, the first recess 531 may have a triangular cross-section. In general, the recesses may have shapes and depths different from one another.

Figure 14:
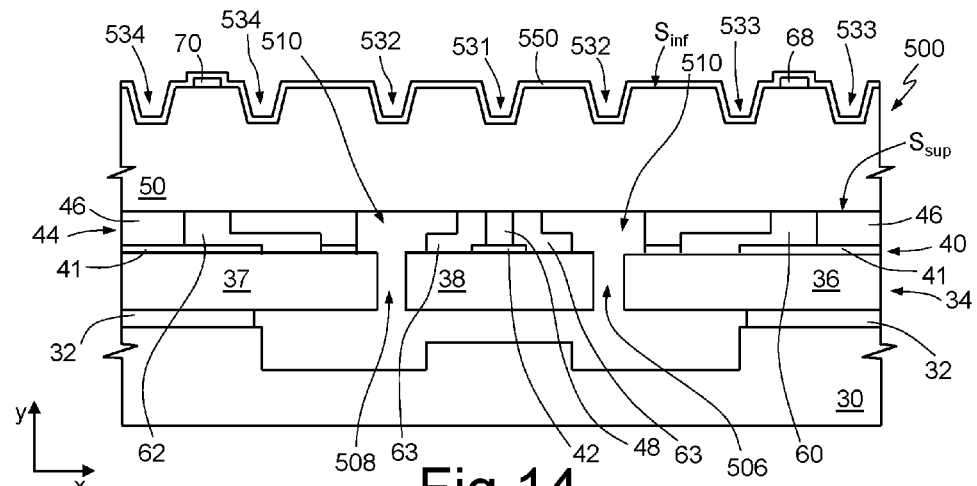

Next, as illustrated in FIG. 14, formed on the bottom surface $S_{inf}$ and within the recesses is a protective layer 550, of a conformable type, thus with a uniform thickness. This protective layer 550 is formed, for example, by a resist, which is sprayed on the microelectronic structure 500, thus coating also the bottom walls and side walls of the first, second, third, and fourth recesses 531, 532, 533 and 534.

Figure 15:
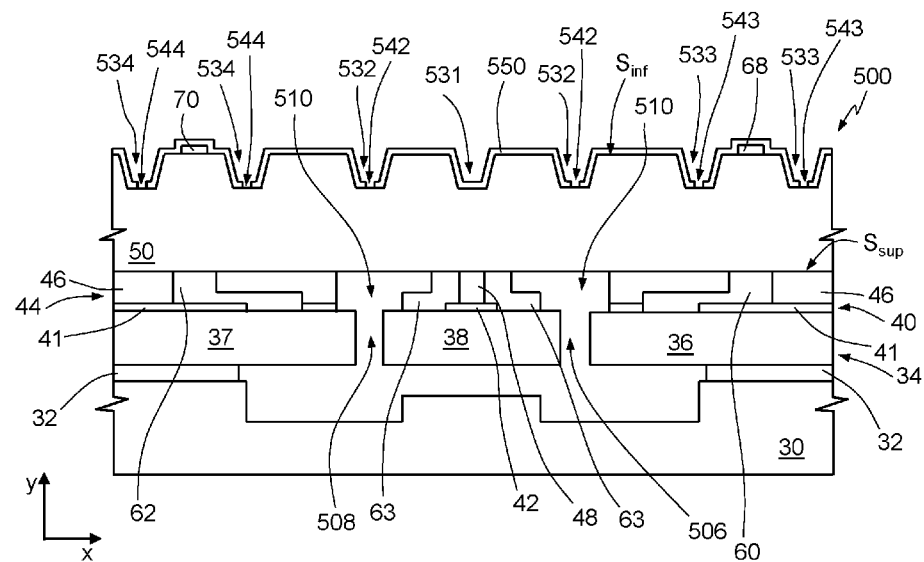

Next, as shown in FIG. 15, portions of the protective layer 550 arranged on the bottom walls of the second, third, and fourth recesses 532, 533, 534 are selectively removed, with photolithographic techniques. In this way, on the bottom of the second, third, and fourth recesses 532, 533, 534, a first window 542, a second window 543, and a third window 544 through the protective layer 550 are, respectively, formed, thus exposing corresponding portions of the substrate 50. Also the first, second, and third windows 542, 543, 544 have an annular shape in top plan view. Furthermore, the first window 542 may be such that portions of the first and second patterning trenches 506, 508 are vertically aligned with respect to portions of the overlying first window 542.

Figure 16:
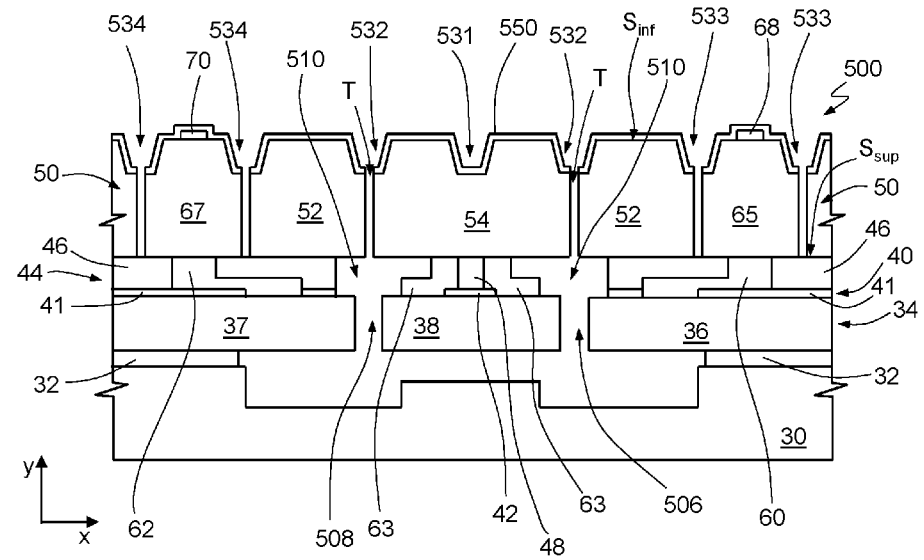

Next, as illustrated in FIG. 16, a DRIE (Deep Reactive-Ion Etch) is carried out through the first, second, and third windows 542, 543, 544 for removing the underlying portions of substrate 50 entirely. In greater detail, this operation leads to formation of the first and second TSVs 65, 67, as well as of the insulation trench T, which is in fluid communication with the process cavity 510 and with the first and second patterning trenches 506, 508. In addition, this operation leads to formation of the fixed portion 52 and the mobile portion 54 of the substrate 50. In particular, the insulation trench T insulates the mobile portion 54 of the substrate 50 from the fixed portion 52, the mobile portion 54 being formed by the portion of substrate 50 connected to the mobile epitaxial sub-region 38 through, among other things, the first and second mobile dielectric regions 42, 48.

In practice, the operations illustrated in FIG. 16 enable release of the first mobile structure 19 with respect to the fixed structure 17 to which it is connected by the aforementioned elastic semiconductor elements 100, and more precisely render them mobile with respect to one another. Further, since the second, third, and fourth recesses 532, 533 and 534 have a same depth, calibration and execution of the DRIE are facilitated, since, underneath the first, second, and third windows 542, 543, 544, always the same thickness of semiconductor material is removed.

Figure 17:
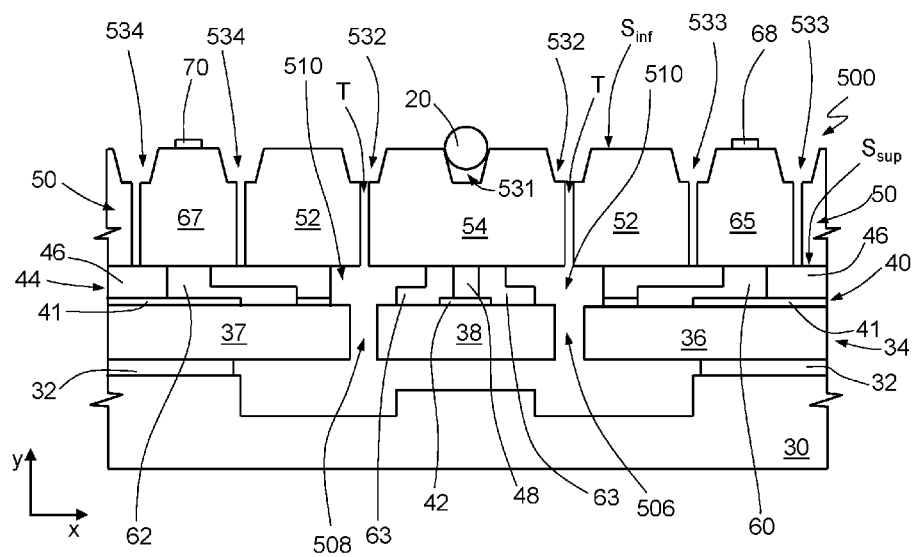

Next, as shown in FIG. 17, the remaining portions of the protective layer 550 are removed, and the first single-mode fiber 20 and the first multi-mode fiber 22 (which is not visible in FIG. 17) are arranged in the first recess 531. In this connection, the embodiment illustrated in FIG. 17 differs from the one illustrated in FIG. 3 in that the first recess 531, which is functionally equivalent to the groove G shown in FIG. 3, has a trapezoidal cross-section, instead of a triangular one.

Figure 18:
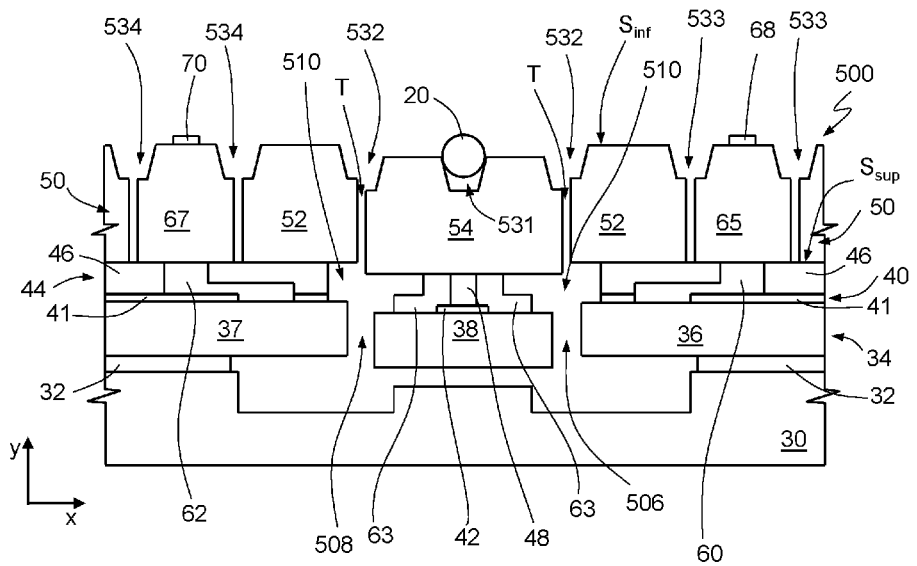

Next, after fixing the first laser diode 2 has been fixed to the fixed structure 17, the first mobile structure 19 is moved as described previously, so as to locate the point in which the first optical beam $B_4$ has, at output from the first multi-mode optical fiber 22, the maximum intensity. This condition is shown, purely by way of example, in FIG. 18. Then, in a way not illustrated, the first and second blocking regions 72, 74 are formed within the insulation trench T. The first and second blocking regions 72, 74 fix the mobile portion 54 of the substrate 52 to the fixed portion 52, thus preventing any further movement of the first mobile structure 19 with respect to the fixed structure 17. In practice, the first and second blocking regions 72, 74 make it possible to maintain the arrangement that guarantees maximum coupling efficiency between the first laser diode 2 and the first single-mode optical fiber 20.

In general, the operations of movement of the first, second, and third mobile structures 19, 119, 219 in order to optimize the optical couplings may be carried out at different times, as likewise formation of the corresponding pairs of blocking regions.

From what has been described and illustrated previously, the advantages that the present solution affords emerge clearly.

In particular, the present projective MEMS device enables generation of an optical beam for applications of the flying spot type that is substantially immune from the phenomenon of astigmatism and with an optimized intensity, at the same time maintaining small overall dimensions. Possibly, also the collimation characteristics may be optimized.

In conclusion, it is clear that modifications and variations may be made to what has been described and illustrated herein, without thereby departing from the scope of the present disclosure.

For instance, the structure of each laser diode may be different from what has been described. In particular, the number, arrangement, shape, and composition of the layers of each laser diode (not described in detail, in so far as they are not relevant for the purposes of the present disclosure), and thus of the corresponding die, may be of any type. Furthermore, one or both of the facets of each laser diode may be formed by corresponding structures designed to guarantee that the facets have desired values of reflectivity; for example, the front facet $F_a$ of each laser diode may be formed by an anti-reflective structure integrated with the corresponding die.

It is further possible for the number of the laser diodes and/or their respective wavelengths to be different from what has been described.

In addition, one or more of the projective modules may be without the corresponding multi-mode optical fiber. Furthermore, one or more of the optical fibers mentioned may (for example) be of the type with a plurality of claddings.

As regards the conditions of alignment of the axes (for example, the axes of the single-mode optical fiber and of the multi-mode optical fiber of a same projective module), limited misalignments are possible of the order of microns, as also between the axes of the fibers of different projective modules (also in this case, of the order of microns). On the other hand, given the small lengths of the fibers mentioned, it is likewise possible for one or more fibers to have locally a non-infinite radius of curvature. In this case, assuming for example the presence of a curved single-mode fiber, the coupling with the corresponding laser diode may be obtained by trying to align the center of emission of the corresponding laser with the point given by the intersection of the (curved) axis of symmetry of the optical fiber with the facet of the optical fiber facing this corresponding laser.

Further possible are embodiments comprising elements additional to what has been described. For instance, one or more of the facets of the fibers described (for example, the first facet $F_1$ of the first single-mode optical fiber 20) may be coated with an anti-reflective layer. One or more fibers may be partially metallized, to enable soldering thereof. Furthermore, as regards the first single-mode fiber of at least one projective module, it may be of a non-lensed type, in which case the first facet $F_1$ is plane. In this case, between the first facet $F_1$ and the front facet $F_a$ of the corresponding die there a lens may be inserted (for example, a hemispherical one) so as to guarantee in any case a good optical coupling. More in general, embodiments are possible (not illustrated) in which, in each projective module, instead of the corresponding single-mode optical fiber, a corresponding multi-mode optical fiber is present, for example of a step-index type. These embodiments are suited to applications of a LIDAR type, since in these applications maximization of the transmitted power is privileged over resolution of the pixel or reduction of astigmatism.

As regards the annular region 63 and each of the elements referred to that have an annular shape, this shape may be of any type (for example, circular or polygonal, in top plan view).

As regards the first rotor elements 101, the second rotor elements 102, and the first, second, third, and fourth stator elements 81, 82, 83, 84, they may have shapes and arrangements different from what has been described.

Finally, as regards the manufacturing process, it is possible for the recesses obtained (illustrated for example in FIG. 13) not to have all either a same shape or a same depth, as mentioned previously.

In addition, embodiments are possible in which the annular region 63 is absent. In this case, the wet etch mentioned with reference to FIG. 10 is carried out with times such as to prevent complete removal of the first and second mobile dielectric regions 42, 48 so as to prevent the mobile epitaxial sub-region 38 from mechanically decoupling from the substrate 50.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A projective MEMS device, comprising:
a fixed supporting structure made at least in part of semiconductor material; and
a number of projective modules, each projective module including:
an optical source fixed to the fixed supporting structure;
a microelectromechanical actuator including a mobile structure, said microelectromechanical actuator being configured to vary a position of said mobile structure with respect to the fixed supporting structure; and
a first optical fiber mechanically coupled to said mobile structure and configured to optically couple to said optical source according to the position of said mobile structure, wherein each projective module further comprises a second optical fiber of a multi-mode type and with a graded refractive index, said second optical fiber being arranged downstream of the corresponding first optical fiber, said second optical fiber being further optically coupled to said corresponding first optical fiber and being mechanically coupled to the corresponding mobile structure.

2. The device according to claim 1, wherein said subsequent optical fiber is configured to operate as a selfoc lens.

3. The device according to claim 2, wherein said subsequent optical fiber has a pitch length P; and wherein said subsequent optical fiber has a length equal to P/4+k·P, where k is a positive or zero integer.

4. A projective MEMS system comprising
a mirror; and
a projective MEMS device optically coupled to the mirror and including:
a fixed supporting structure made at least in part of semiconductor material; and
a number of projective modules, each projective module including:
an optical source fixed to the fixed supporting structure;
a microelectromechanical actuator including a mobile structure, said microelectromechanical actuator being configured to vary a position of said mobile structure with respect to the fixed supporting structure; and
a first optical fiber mechanically coupled to said mobile structure and configured to optically couple to said optical source according to the position of said mobile structure, wherein each projective module further comprises a second optical fiber of a multi-mode type and with a graded refractive index, said second optical fiber being arranged downstream of the corresponding first optical fiber, said second optical fiber being further optically coupled to said corresponding first optical fiber and being mechanically coupled to the corresponding mobile structure.

5. A portable electronic apparatus comprising:
a casing; and
a projective MEMS system coupled to the casing and including:
a mirror; and
a projective MEMS device optically coupled to the mirror and including:
a fixed supporting structure made at least in part of semiconductor material; and
a number of projective modules, each projective module including:
an optical source fixed to the fixed supporting structure;
a microelectromechanical actuator including a mobile structure, said microelectromechanical actuator being configured to vary a position of said mobile structure with respect to the fixed supporting structure; and
a first optical fiber mechanically coupled to said mobile structure and configured to optically couple to said optical source according to the position of said mobile structure, wherein each projective module further comprises a second optical fiber of a multi-mode type and with a graded refractive index, said second optical fiber being arranged downstream of the corresponding first optical fiber, said second optical fiber being further optically coupled to said corresponding first optical fiber and being mechanically coupled to the corresponding mobile structure.

6. The portable electronic apparatus according to claim 5, wherein said projective MEMS system is a stand-alone accessory having a casing releasably coupled to the casing of said portable electronic apparatus.

7. The portable electronic apparatus of claim 5, wherein said projective MEMS system is formed in an integrated way within the casing of said portable electronic apparatus.

8. The device according to claim 1, wherein the first optical fiber of each projective module is a single-mode optical fiber.

9. The device according to any claim 1, wherein the optical source of each of said projective modules is a bare-chip optical source.

10. The device according to claim 1, further comprising at least one elastically deformable element mechanically coupling each mobile structure to the fixed supporting structure, wherein the microelectromechanical actuator of each projective module further comprises a fixed region of semiconductor material, fixed to said fixed supporting structure; and wherein the mobile structure of each microelectromechanical actuator comprises a mobile region of semiconductor material, which is mechanically coupled to the fixed supporting structure by the at least one elastically deformable element; and wherein the fixed region and the mobile region of each projective module are configured to be electrically controlled so as to vary the position of the mobile region with respect to the fixed region.

11. The device according to claim 10, wherein the mobile structure of each microelectromechanical actuator further comprises:
a front region of semiconductor material, configured to carry the corresponding first optical fiber; and
an intermediate region arranged between the front region and the mobile region and configured to keep the front region and the mobile region fixed together.

12. The device according to claim 11, wherein said intermediate region comprises an inner portion of dielectric material and an outer portion of polysilicon or silicon nitride, which laterally surrounds the inner portion.

13. The device according to claim 11, wherein said fixed region and said mobile region of each microelectromechanical actuator comprise corresponding comb-fingered elongated elements.

14. The device according to claim 10, wherein the mobile structure of each microelectromechanical actuator further comprises:
a front region of semiconductor material, configured to carry the corresponding first optical fiber and the corresponding second optical fiber; and
an intermediate region, which is arranged between the front region and the mobile region and is configured to keep the front region and the mobile region fixed together.

15. The device according to claim 10, further comprising a cap of semiconductor material; and wherein the mobile region of each microelectromechanical actuator overlies, at a distance, said cap and is configured to be biased at a voltage different from a voltage of said cap.

16. The device according to claim 1, wherein the optical sources of said number of projective modules are configured to generate respective input optical beams that are spatially arranged at a distance apart from each other, said device further comprising a dichroic optical structure mechanically coupled to said fixed supporting structure and configured to receive said input optical beams and to superimpose the input optical beams spatially for forming substantially a single output optical beam.

17. The device according to claim 1, wherein each first optical fiber has a facet facing the corresponding optical source, said facet forming a lens configured to increase a coupling coefficient between said corresponding optical source and said first optical fiber.

18. The device according to claim 1, wherein said number of projective modules is equal to three, and include three optical sources configured to generate red, green, and blue visible electromagnetic radiation, respectively.

19. The device according to claim 1, wherein each projective module comprises at least one blocking region configured to fix the position of the mobile structure of the respective microelectromechanical actuator with respect to the fixed supporting structure.

20. The projective MEMS system according to claim 4, further comprising at least one elastically deformable element mechanically coupling each mobile structure to the fixed supporting structure, wherein the microelectromechanical actuator of each projective module further comprises a fixed region of semiconductor material, fixed to said fixed supporting structure; and wherein the mobile structure of each microelectromechanical actuator comprises a mobile region of semiconductor material, which is mechanically coupled to the fixed supporting structure by the at least one elastically deformable element; and wherein the fixed region and the mobile region of each projective module are configured to be electrically controlled so as to vary the position of the mobile region with respect to the fixed region.

* * * * *